(12) United States Patent
Margalit et al.

(10) Patent No.: US 8,972,828 B1
(45) Date of Patent: Mar. 3, 2015

(54) HIGH SPEED INTERCONNECT PROTOCOL AND METHOD

(75) Inventors: Niv Margalit, Ramat HaSharon (IL); Eyal Oren, Kfar Hess (IL); Rami Zemach, Givat Shapira (IL); Dan Zislis, Giv'atayim (IL)

(73) Assignee: Compass Electro Optical Systems Ltd., Netanya (IL)

( * ) Notice: Subject to any disclaimer, the term of this patent is extended or adjusted under 35 U.S.C. 154(b) by 83 days.

(21) Appl. No.: 13/534,835

(22) Filed: Jun. 27, 2012

Related U.S. Application Data

(63) Continuation-in-part of application No. 12/560,449, filed on Sep. 16, 2009, now abandoned.

(60) Provisional application No. 61/097,879, filed on Sep. 18, 2008.

(51) Int. Cl.
*H03M 13/00* (2006.01)

(52) U.S. Cl.
USPC ............................................ 714/776; 714/777

(58) Field of Classification Search
USPC .................................. 714/746, 776, 777, 799
See application file for complete search history.

(56) References Cited

U.S. PATENT DOCUMENTS

| | | | | |
|---|---|---|---|---|
| 5,121,396 A * | 6/1992 | Irvin et al. | ..................... | 714/807 |
| 5,276,714 A * | 1/1994 | Hori et al. | ..................... | 375/368 |
| 5,488,617 A * | 1/1996 | Van Driel | ....................... | 714/753 |
| 7,286,982 B2 * | 10/2007 | Gersho et al. | .................. | 704/223 |
| 7,315,815 B1 * | 1/2008 | Gersho et al. | .................. | 704/223 |
| 7,484,161 B2 * | 1/2009 | Dell et al. | ...................... | 714/758 |

* cited by examiner

*Primary Examiner* — Phung M Chung
(74) *Attorney, Agent, or Firm* — Wilmer Cutler Pickering Hale and Dorr LLP

(57) ABSTRACT

A method of error mitigation for transferring packets over a chip-to-chip data interconnect using a high speed interconnect protocol, the method including grouping a pre-selected number of high speed interconnect protocol words to form a protection frame, adding at least one additional error protection bit to each word in the group, adding a synchronization bit to each word, using the synchronization bit in a first word in each frame for synchronization of the protection frame and detecting and correcting a single bit error in the protection frame using the additional error protection bits, thereby reducing packet drop when the frames are transferred over the high speed data interconnect.

5 Claims, 3 Drawing Sheets

HIGH SPEED INTERCONNECT PROTOCOL AND METHOD

CROSS-REFERENCE TO RELATED APPLICATION

This application is a continuation-in-part of and claims priority under 35 U.S.C. §120 to U.S. patent application Ser. No. 12/560,449, filed on Sep. 16, 2009, now abandoned, entitled "HIGH SPEED INTERCONNECT PROTOCOL AND METHOD," the contents of which are incorporated herein in their entirety by reference, which claims priority under 35 U.S.C. §119(e) to U.S. Provisional Application No. 61/097,879, filed on Sep. 18, 2008, which is incorporated herein by reference in its entirety.

FIELD OF THE INVENTION

The present invention relates to a chip to chip interconnect protocol, in general and, in particular, to error mitigation in a high speed interconnect protocol.

BACKGROUND OF THE INVENTION

In conventional data communication networks, there is an issue of the data packet drop rate as a result of the physical interface error rate, i.e., data packets are dropped as a result of errors introduced into the packets due to the physical interface. If, for example, there is a physical error rate of 10e-12, then for an interface of 1 Tb/sec, one packet will be dropped every 1 second. This issue becomes serious as typical interfaces, that currently transfer data at speeds in the range of 10 Gb/sec, become much faster and reach the range of 1 Tb/sec ($10^{12}$ b/sec). At these speeds, physical error rates that were in the range of $10^{-18}$ can drop to $10^{-12}$. In other words, while the packet drop rate for a 10 Gb/sec line with an error rate of $10^{-18}$ can be as low as one packet drop every 3 years, the rate can rise to a packet drop every 1 second for an interface of 1 Tb/sec with a physical error rate of $10^{-12}$. With new requirements for very high bit rate transmission between chips in modern equipment, this packet drop number is unacceptable.

There are known a number of interconnect protocols for use at high transmission speeds. These protocols transmit over a number of channels in parallel. Since conventional ECC (Error Correcting Code) provides protection only for serial data transmission, different protection is required for parallel channels.

One example of a high speed chip-to-chip interconnect protocol is called Interlaken. Interlaken is a scalable chip-to-chip interconnect protocol designed to enable transmission speeds from 10 Gbps to 100 Gbps and beyond. Using the latest SERDES (serialize-de-serialize) technology and a flexible protocol layer, Interlaken minimizes the number of connection pins and power overhead of chip-to-chip interconnects and provides a scalable solution that can be used throughout an entire system. In addition, Interlaken uses error checking and a data scrambler to ensure data integrity and link robustness.

There are two fundamental structures that define the Interlaken Protocol: the data transmission format and the Meta Frame. Data sent across the interface is segmented into bursts, which are subsets of the original packet data. Each burst is bounded by two control words, one before and one after, and sub-fields within these control words affect either the data following or preceding them, for functions like start-of-packet, end-of-packet, error detection, etc. The Meta Frame is defined to support the transmission of the data over a SERDES infrastructure. It encompasses a set of four unique control words, which are defined to provide lane alignment, scrambler initialization, clock compensation, and diagnostic functions. The Meta Frame runs in-band with the data transmissions, using the specific formatting of the control words to distinguish it from the data.

Currently, the basic word that is transferred by the Interlaken protocol is 67 bits wide, where 64 bits are data and 3 bits are framing bits. Incorporated in these 67 bits are error detection bits, e.g., CRC (Cyclical Redundancy Checking). However, while this CRC protection for the data bits will guarantee (to some extent) that error packets will be detected and dropped, it will not improve the drop rate.

As stated above, the Interlaken protocol defines control words and data words. Each control word has 24 bits of CRC in it that protect the control word itself and all the data words in the frame until the next control word. The minimum number of data words between two control words is 4 and the maximum number of data words between two control words is not limited by the protocol. A typical number of data words between control words is 32. However, this protection is limited to certain transmission rates.

Accordingly, it would be very desirable to provide protection for parallel transmissions over a plurality of channels, so as to minimize the packet drop rate during high speed data transfer, particularly for use with the Interlaken protocol.

Chip-to-Chip interfaces are used for communicating data between two neighbor chips in the same box. The interface can be implemented using SerDes technology, to meet high bandwidth requirements for transferring high-rate data between chips.

SerDes technology is very efficient for transferring data between two chips. SerDes units can operate at a very high speed and can serialize data, which results in fewer pins in the chip package.

However, the error rate in chip-to-chip communications can be high and can result in lost data. Therefore, there is a need for error correcting codes that minimize or eliminate the error rate.

SUMMARY OF THE INVENTION

According to aspects of the present invention, a method for providing error mitigation in a chip for transferring packets over a chip-to-chip data interconnect using a high speed interconnect protocol is disclosed. The method comprises grouping in the chip a pre-selected number of high speed interconnect protocol words to form a protection frame, adding in the chip at least one additional error protection bit to each word in said grouped words, and adding in the chip a synchronization bit to each word. According to aspects of the present invention, the synchronization bit in a first word in each frame provides for synchronization of said protection frame and the additional error protection bit provides for detecting and correcting a single bit error in the protection frame.

The method reduces significantly the packet error rate in a high speed interconnect protocol at high data transfer rates in parallel channels, e.g., from 10 Gbps to 100 Gbps and higher. According to an embodiment, the method is utilized to reduce the packet drop rate in transmissions using the Interlaken chip to chip interconnect protocol but, alternatively, it can be applied to other high speed data protocols.

The present invention relates to a method of error control for data that flows in the high speed interconnect between chips or between any physical devices that use the high speed interconnect protocol. The method includes grouping a pre-selected number of high speed data interconnect protocol words to form a protection frame and adding additional error protection bits to each word of the frame, providing single bit error detecting and correcting capability, so as to reduce the error rate of transmitted frames at high data transfer rates. According to an embodiment, an additional bit is added to each protection frame for initial synchronization and data alignment.

There is thus provided, according to some embodiments, a method of error mitigation for transferring packets over a chip-to-chip data interconnect using a high speed interconnect protocol, the method including grouping a pre-selected number of high speed interconnect protocol words to form a protection frame, adding at least one additional error protection bit to each word in the group, adding a synchronization bit to each word, using the synchronization bit in a first word in each frame for synchronization of the protection frame and detecting and correcting a single bit error in the protection frame using the additional error protection bits, thereby reducing packet drop when the frames are transferred over the high speed data interconnect.

According to one embodiment, the step of adding includes adding at least one error correction bit to each word and one synchronization bit to each protection frame including three Interlaken words.

There is also provided a frame for transmitting over a chip-to-chip data interconnect using a high speed interconnect protocol, the frame including a group of interconnect protocol words forming a protection frame, at least one additional bit associated with each word in the protection frame for single error detection and correction in the protection frame, for reducing error rate of transmitted frames, and a synchronization bit associated with each word in the protection frame for identifying a start of the protection frame.

According to an embodiment, the at least one additional bit includes additional error protection bits to provide double error detection capability.

According to one embodiment, the at least one additional bit includes bits added to the interconnect protocol word for generating a Hamming code comprising a prescribed number of redundant bits and data bits enabling a single bit error correction and two bits error detection.

BRIEF DESCRIPTION OF THE DRAWINGS

The present invention will be further understood and appreciated from the following detailed description taken in conjunction with the drawings in which.

DETAILED DESCRIPTION OF THE INVENTION

The present invention relates to reduction of packet error rate in transmissions using high speed chip-to-chip interconnect protocols. It will be appreciated that this error rate changes substantially depending on the quality of the implementation. One example of such a protocol is the Interlaken data formatting protocol. The proposed solution for error mitigation is to add additional coding protection, for example, ECC protection, to the data that goes through the physical interface. The coding protection has the capability to correct a single error and, preferably, to detect two errors in the augmented protocol word (i.e., Single Error Correction/Double Error Detection (SECDED)).

One example of the present invention is implemented in transmissions using the Interlaken protocol. Currently, the basic word that is transferred by the Interlaken core is 67 bits wide. According to the present invention, additional protection is provided to groups of words of a pre-selected size, herein described as a protection frame. According to a preferred embodiment, 4 bits of ECC protection are added to every Interlaken word, making it 71 bits wide, and three such words form an Interlaken protection frame.

Figure 1:
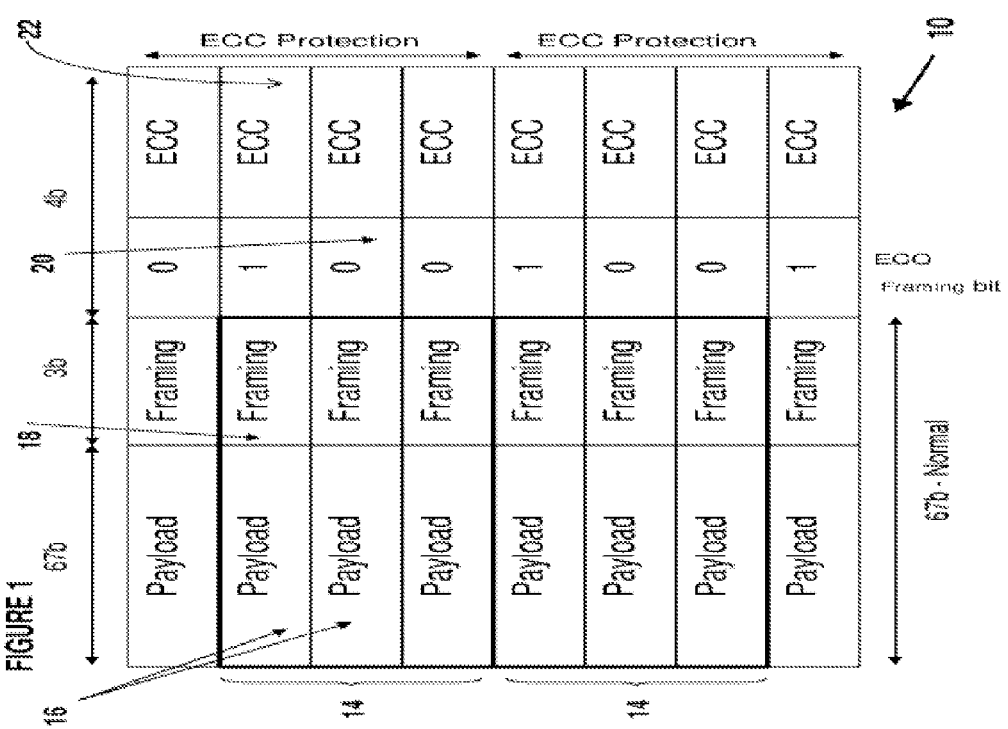
FIG. 1 is a schematic illustration of the format of a group of words including a protection frame constructed and operative in accordance with one embodiment of the present invention.

FIG. 1 shows the array 10 of eight Interlaken words 12, including two protection frames 14, constructed and operative in accordance with one embodiment of the present invention. Protection frame 14 is formed of three Interlaken words 12. It will be appreciated that the Interlaken frames, themselves, are not changed. After completing the protection, the extra 4 bits are removed and the Interlaken word remains as it was. In other words, there are two different frames involved: a frame of Interlaken itself, and an additional synchronization (protection) frame for ECC protection according to the present invention.

As can be seen, each modified Interlaken word 12 includes 64 bits of payload 16 and 3 bits of Interlaken framing 18. These 67 bits form the original Interlaken word. CRC is typically provided, as part of the payload, in each Interlaken control word for error detection. According to the illustrated embodiment, 1 bit 20 of ECC framing, and 3 bits 22 of ECC protection are added to each original Interlaken word 12 (payload plus Interlaken framing).

In order to reduce the cost of adding protection to a high speed interconnect protocol, it is preferable to optimize the number of words in each protection frame, depending on the width of the words in that protocol, and considerations of decoding delay and code strength in the particular protocol. For the Interlaken protocol, an optimal protection frame includes three words. Thus, every group of 3 words of Interlaken, that include 201 (67×3) data bits, is protected by a 9 bit ECC code. Alternatively, the coding can be implemented on protection frames of a different length (for example, 2 words or 4 or 5 words), although these are more costly in terms of resources. It will be appreciated that, in other protocols, the optimum frame length may differ.

It is a particular feature that at least single error detection and correction are provided. However, according to some embodiments, the protection can provide Single Error Correction/Double Error Detection (SEC-DED). Thus, in the above example of an Interlaken protocol, the ECC is preferably SEC-DED and is based on a Hamming SEC-DED code. Thus, adding error protection includes adding bits to the interconnect protocol word for generating a Hamming code including a prescribed number of redundant bits and data bits enabling a single bit error correction and, preferably, two bits error detection. Preferably, the error protection includes the capability of correcting a bit error in the Hamming code and generating an indication signal representative of the correction in response to the bit error in the Hamming code and for generating a second indication signal in response to one or two errors detected.

Furthermore, it can be important to identify the beginning and end of each protection frame. This can be accomplished by adding an error synch bit (such as ECC framing synch bit 20) to the protocol word at a prescribed location. According to one embodiment, the first word of each protection frame is indicated by an error synch bit. In the Interlaken protection frame illustrated in FIG. 1, the beginning of each protection frame is marked by setting an ECC framing synch bit to 1.

At power up, i.e., when the ECC or other protection interface gets out of reset, no protection checks can be carried out until the protection interface identifies the start of a protection frame. When the synch bit is identified, the protection interface synchronizes on the protection frame. The protection logic now removes the bits of protection code from the original protocol word and performs the error check. For example, when the Interlaken core goes out of reset, it is not possible to do any ECC checks until the ECC logic determines where a frame begins. When the ECC logic synchronizes on the ECC protection frames with the ECC synch bit of the first word, the ECC logic (which is the ECC checking module) can start taking in sets of protection frames (201 bits plus 9 bits of protection code). When the ECC protection frames are synchronized, then all the 71 bits in each word are fully protected by the ECC logic. The ECC logic now removes the 9 bits of protection code and checks whether there are any errors in the protection frame, as known. Preferably, the ECC framing synch bit is also removed. The Interlaken or other protocol word has now been restored to its original format, so the entire protection process of the invention is transparent to the protocol.

An advantage of building ECC or other error protection into the frames is that, with a relatively small overhead of logic and power, the error rate of the system can be reduced from $10^{-12}$ to $10^{-24}$. Thus, for example, on a 1 Tb/sec system, it is possible to reduce the error rate from a packet drop every 1 second to a packet drop rate which is larger than the lifetime of the product.

Known protection mechanisms are configured to protect the payload portion of the word or a critical part thereof only, while leaving the data transmission subject to synchronization loss due to framing errors. Thus, only the payload or part thereof is protected from errors and no protection is provided to the rest of the frame. As a result, if a frame is dropped due to an error in the framing or the control bits, the payload is lost as well. An advantage of the error protection according to the present invention is that it can be used in respect of all data, including the control and framing portions of the Interlaken or any other protocol. Once synchronization is established, the error protection according to the present invention is provided to all bits of the payload and framing of the Interlaken word, thus a much more stable error protection protocol is accomplished.

Figure 2:
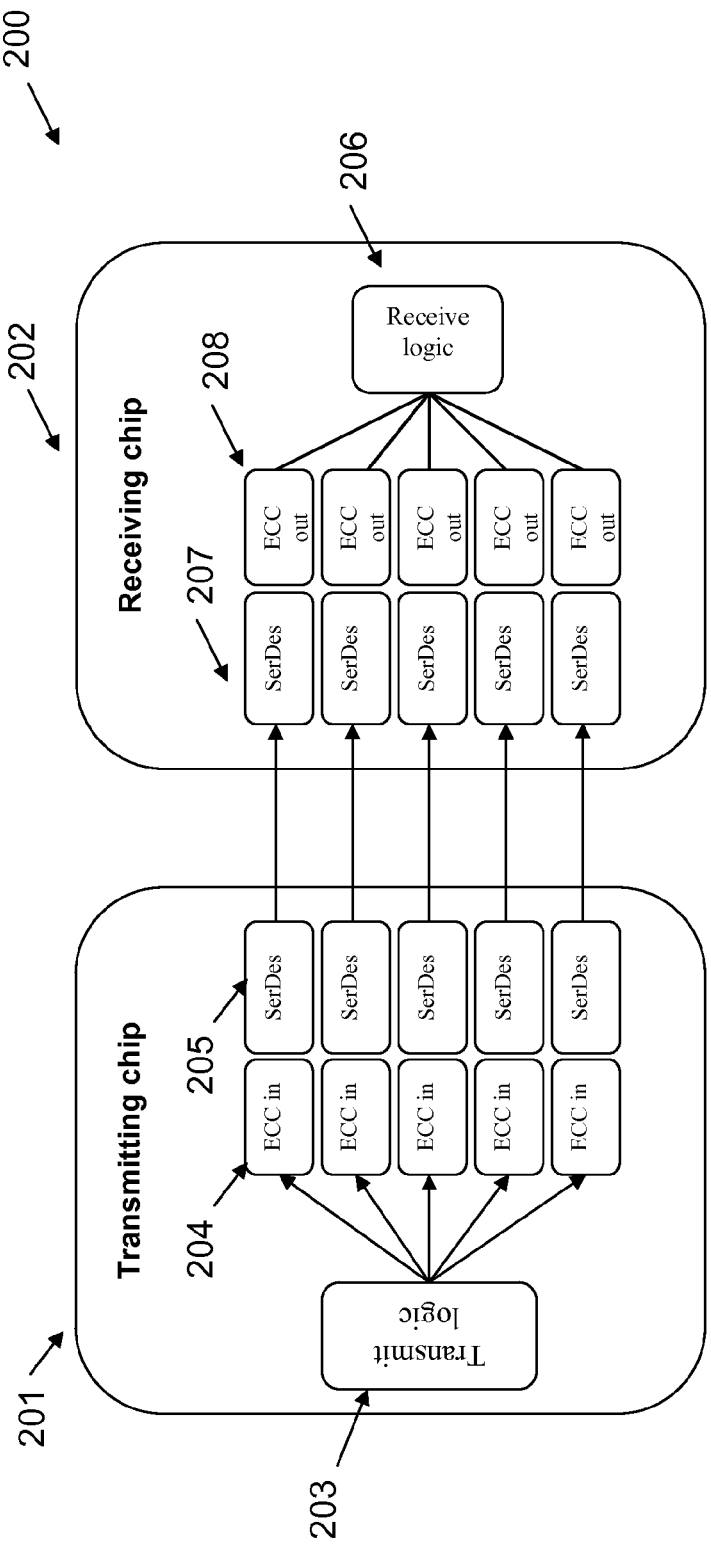
FIG. 2 shows an exemplary chip-to-chip interface according to embodiments of the present invention.

FIG. 2 shows an exemplary chip-to-chip interface 200 according to aspects of the present invention. The chip-to-chip interface 200 includes a transmitting chip 201 and a receiving chip 202. The transmitting chip 201 includes transmit logic block 203, "ECC in" blocks 204 for performing error correcting coding on the transmit side, and "SerDes" blocks 205 for transmitting the data to the receiving chip 202. The receiving chip 202 includes "SerDes" blocks 207 for receiving the data from the transmitting chip 201, "ECC out" blocks 208 for performing error correcting coding on the receive side, and receiving logic block 206.

The transmit logic block 203 distributes the data over the different SerDes blocks 205. The number of the SerDes blocks employed depends on the desired data rate. For example, if the data rate required between the two chips is 100 Gbps and each SerDes block operates at 10 Gbps, then 10 SerDes blocks are required to meet the required bandwidth. Accordingly, the transmit logic block 203 will distribute the data over ten SerDes blocks.

Before pushing the data into the SerDes blocks 205, the transmit logic inserts an error correcting code (ECC) for protecting the data before transmitting it. As is shown in FIG. 2, between the transmit logic block 203 and the SerDes blocks 205, "ECC in" blocks 204 insert the ECC for each SerDes block.

The receiving chip is responsible for checking whether there is corruption in the received data and for constructing the data into a single data flow. The receiving chip 202 receives the incoming data from all of the SerDes transmitting blocks 205. In the receiving chip 202, there is a corresponding receiving SerDes block 207 for each transmitting SerDes block 205. The receive logic 206 and the "ECC out" blocks 208 are responsible for removing the ECC and for checking the incoming data and fixing any detected errors.

As described above in connection with FIG. 1, the data pushed into the SerDes blocks 205 is structured into a fixed size data word. Each data word is protected by ECC, by attaching the ECC to the data word.

The data word, which consists of the payload 16 and the framing 18, as shown in FIG. 1, is pushed serially in a SerDes block as one constant stream of data. The sync bit 20 can be used by the receive logic block and the "ECC out" block on the receive side to identify the ECC frames and build the correct ECC code and match it to the proper data bits.

In some embodiments, both the ECC generation and the ECC checking is done as a full in-band logic and requires no additional memory elements on the transmit and/or receive side.

ECC protection is widely used in chips for protecting data and in most cases it is used for protecting data in memory access. Memory access transactions are well timed transactions. Therefore, it can be determined beforehand, which data is written to the memory and which data is read from the memory. Once a write transaction is launched, the proper ECC logic can identify the logic write command and add the ECC code to the write data. Similarly, in a read transaction, every time a read transaction is launched, it can be determined how much data will be read by the memory and when the data will be read. The ECC checker code can then be triggered and verify that the read data is correct.

Chip-to-chip data is transmitted as a constant stream of data and is not transaction based. Adding ECC protection to this kind of traffic requires an optimization of how many ECC bits are inserted in the data stream, so that the bandwidth overhead of the ECC will be minimal. A synchronization mechanism is also desirable, so that the receiving logic can align the correct data bits to the proper ECC code.

It is also desirable, to have the receiving side know how to handle errors on the synchronization bit. To avoid losing synchronization, the ECC should also protect the synchronization bit. In this case, if the error occurs on the synchronization bit, the ECC code can fix it and the receive logic will continue operating properly.

When the connection between the two chips is established after reset, the ECC checker logic on the receive side is initially not activated and the receive logic at this stage is searching for the sync bit until it locks on the ECC frame. Once the lock is achieved, the ECC checker is activated and the protection mechanism is fully operational.

Until the full frame lock is achieved, the transmit side is sending idle data to allow the receiver chip to lock. After the ECC frame lock is achieved, the transmitter can start sending full traffic.

Figure 3:
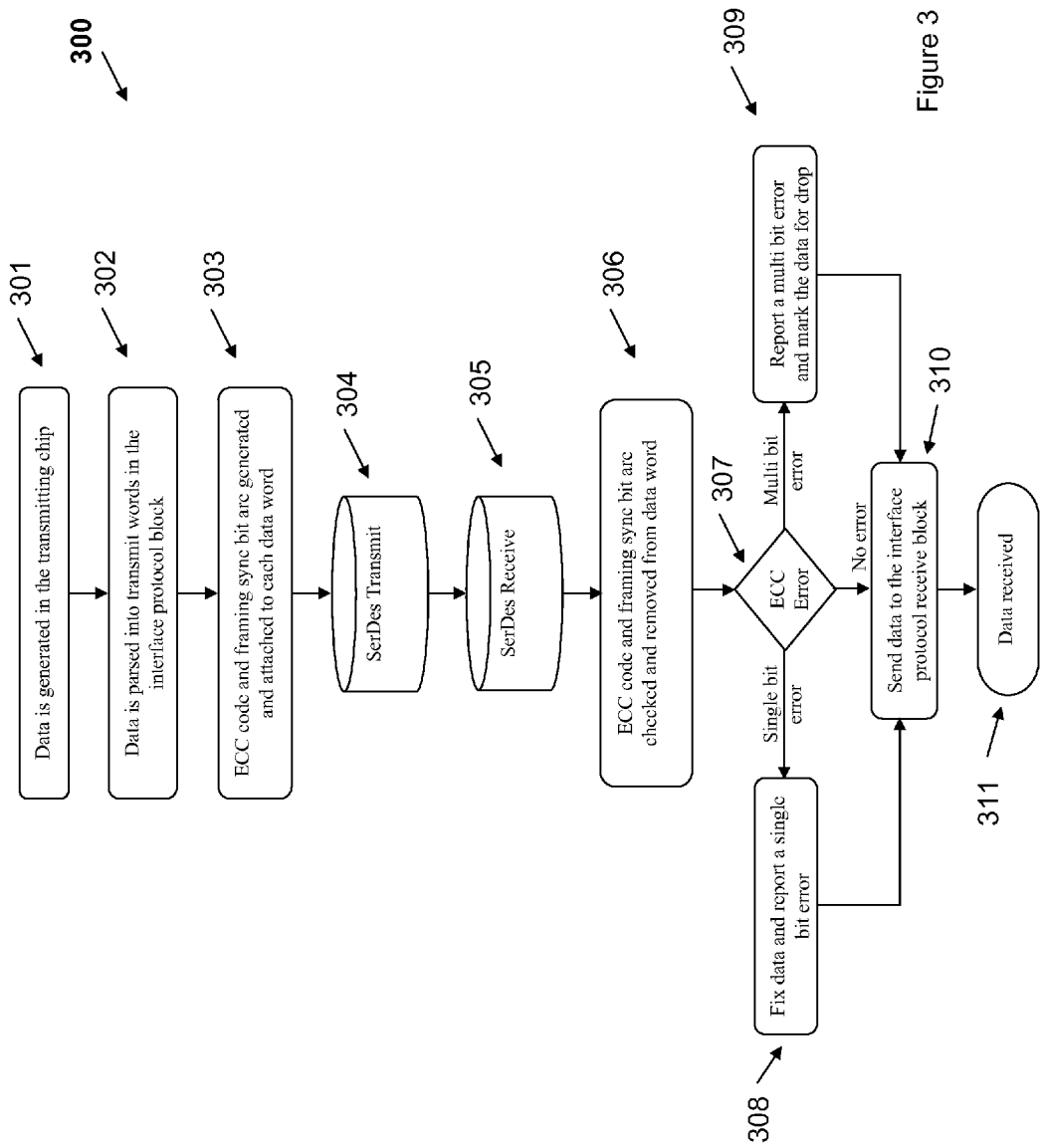
FIG. 3 shows a flow chart with the steps to perform error correction coding according to embodiments of the present invention.

FIG. 3 shows a flow chart that describes the different steps in the data flow from the time it is generated in the transmitting chip to the time it is has been received by the receiving chip.

In step 301, the data is generated in the transmitting chip. Then, in step 302, data is parsed into transmit words. In step 303, the ECC and framing sync bit are generated and attached to each data word. Then the SerDes blocks in the transmitting chip and the receiving chip, transmit and receive the data in steps 304 and 305, respectively.

After the data is received, in step 306 the ECC and framing sync bit are checked and removed from the received data. In step 307, the logic checks for ECC errors. If there is a single-bit error, the logic fixes the data and reports the single-bit error in step 308. If there is a multi-bit error, the logic reports the multi-bit error, and marks the received data for dropping in step 309. If there is no error, the data is send to an interface protocol receive block in step 310. This completes the data reception, which is shown in step 311.

While the invention has been described with respect to a limited number of embodiments, it will be appreciated that many variations, modifications and other applications of the invention may be made. It will further be appreciated that the invention is not limited to what has been described hereinabove merely by way of example. Rather, the invention is limited solely by the claims which follow.

The invention claimed is:

1. A method of providing for error mitigation in a chip for transferring packets over a chip-to-chip data interconnect using a high speed interconnect protocol, the method comprising:
grouping in the chip a pre-selected number of high speed interconnect protocol words to form a protection frame;
adding in the chip at least one additional error protection bit to each word in said grouped words;
adding in the chip a synchronization bit to each word; and sending the words over a serial interface,
wherein the synchronization bit in a first word in each frame provides for synchronization of said protection frame; and
wherein the at least one additional error protection bit in each word of the protection frame is used collectively with the other additional error protection bits as a single error correction code that provides for detecting and correcting a single bit error in the protection frame.

2. The method according to claim 1, further comprising detecting double errors in said protection frame using said additional error protection bits.

3. The method according to claim 1, wherein said step of adding error protection includes adding bits to the interconnect protocol word for generating a Hamming code comprising a prescribed number of redundant bits and data bits enabling a single bit error correction and two bits error detection.

4. The method according to claim 3, wherein the added error protection permits correcting bit error in said Hamming code and generating an indication signal representative of said correction in response to the bit error in said Hamming code and permits generating a second indication signal in response to one or two errors detected.

5. A method of providing for error mitigation in a chip for receiving packets over a chip-to-chip data interconnect using a high speed interconnect protocol, the method comprising:
receiving in the chip a pre-selected number of high speed interconnect protocol words grouped to form a protection frame,
wherein each high speed interconnect protocol word includes at least one added error protection bit and an added synchronization bit;
synchronizing in the chip, using the synchronization bit in a first word in each protection frame;
using the at least one additional error protection bit in each word of the protection frame collectively to determine a single error correction code; and
detecting and correcting in the chip, using the determined single error correction code, at least a single bit error in the protection frame.

\* \* \* \* \*